United States Patent
Yeh et al.

(10) Patent No.: US 8,872,173 B2
(45) Date of Patent: Oct. 28, 2014

(54) THIN FILM TRANSISTOR STRUCTURE AND ARRAY SUBSTRATE USING THE SAME

(71) Applicant: E Ink Holdings Inc., Hsinchu (TW)

(72) Inventors: Chia-Chun Yeh, Hsinchu (TW);
Xue-Hung Tsai, Hsinchu (TW);
Cheng-Hang Hsu, Hsinchu (TW);
Wei-Tsung Chen, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/781,780

(22) Filed: Mar. 1, 2013

(65) Prior Publication Data

US 2013/0320329 A1   Dec. 5, 2013

Related U.S. Application Data

(60) Provisional application No. 61/655,953, filed on Jun. 5, 2012.

(30) Foreign Application Priority Data

Oct. 25, 2012   (TW) .............................. 101139490 A

(51) Int. Cl.
| | | |
|---|---|---|
| *H01L 29/10* | (2006.01) | |
| *H01L 29/12* | (2006.01) | |
| *H01L 29/786* | (2006.01) | |
| *H01L 27/12* | (2006.01) | |

(52) U.S. Cl.
CPC ........ *H01L 29/7869* (2013.01); *H01L 27/1222* (2013.01); *H01L 27/1214* (2013.01); *H01L 27/1225* (2013.01); *H01L 27/1248* (2013.01)
USPC .......................................................... 257/43

(58) Field of Classification Search
CPC ....................... H01L 29/7869; H01L 27/1214
USPC .............................................................. 257/43
See application file for complete search history.

(56) References Cited

U.S. PATENT DOCUMENTS

| | | | |
|---|---|---|---|
| 7,952,392 B2 | 5/2011 | Koyama et al. | |
| 8,012,794 B2 * | 9/2011 | Ye ................... | 438/104 |
| 8,067,775 B2 | 11/2011 | Miyairi et al. | |
| 8,188,477 B2 | 5/2012 | Miyairi et al. | |
| 2011/0163310 A1 | 7/2011 | Park et al. | |
| 2011/0180789 A1 | 7/2011 | Han et al. | |
| 2012/0175608 A1* | 7/2012 | Yamazaki ........................ | 257/43 |
| 2012/0224112 A1* | 9/2012 | Yasukawa .......................... | 349/5 |

* cited by examiner

*Primary Examiner* — Phat X Cao
(74) *Attorney, Agent, or Firm* — CKC & Partners Co., Ltd.

(57) ABSTRACT

A thin film transistor structure is provided. The thin film transistor structure includes a first transistor having a first active layer, a second transistor having a second active layer, a first protection layer contacting the first active layer, and a second protection layer contacting the second active layer. The oxygen contents of the first and the second protection layers are controlled to affect the oxygen vacancy number of the first and the second active layers to satisfy the various electronic requirements of the first and the second transistors.

20 Claims, 3 Drawing Sheets

THIN FILM TRANSISTOR STRUCTURE AND ARRAY SUBSTRATE USING THE SAME

CROSS-REFERENCE TO RELATED APPLICATION

This application claims the priority benefit of provisional application Ser. No. 61/655,953, filed Jun. 5, 2012, the full disclosure of which is incorporated herein by reference. This application also claims the priority benefit of Taiwan application serial no. 101139490, filed Oct. 25, 2012, the full disclosure of which is incorporated herein by reference.

BACKGROUND

1. Technical Field

The disclosure relates to a structure of a semiconductor device. More particularly, the disclosure relates to a structure of thin film transistors.

2. Description of Related Art

When an active layer of a thin film transistor is made from a metal oxide semiconductor material, the tolerances of positive bias stress (PBS) and negative bias stress (NBS) are related to the amount of the oxygen vacancies in the metal oxide semiconductor material. When the metal oxide semiconductor material has more oxygen vacancies, the thin film transistor has better PBS tolerance, but poorer NBS tolerance. When the metal oxide semiconductor material has less oxygen vacancies, the thin film transistor has better NBS tolerance, but poorer PBS tolerance.

Since the thin film transistors in a display have various utilities and thus have various use conditions, some thin film transistors need better PBS tolerance, and some thin film transistors need better NBS tolerance. For example, in an organic light emitting diode display, each pixel needs two thin film transistors. One thin film transistor is a switch transistor, and the other thin film transistor is a driving transistor. The switch transistor stays in "off" state longer, and therefore the switch transistor need better NBS tolerance. The driving transistor stays in "on" state longer, and thus need better PBS tolerance. Accordingly, how to satisfy the various requirements of various transistors at the same time is a problem to be solved.

SUMMARY

In one aspect, the present invention is directed to a thin film transistor structure for adjusting the tolerances of NBS and PBS.

The thin film transistor structure includes a first transistor, a second transistor, a first protection layer, and a second protection layer. The first transistor includes a first gate, a gate insulating layer, a first active layer, a first source, and a first drain. The first gate, the gate insulating layer, and the first active layer are sequentially stacked on the substrate. The first source and the first drain are respectively located on two sides of the first gate and connect the first active layer. The second transistor includes a second gate, a gate insulating layer, a second active layer, a second source, and a second drain. The second gate, the gate insulating layer, and the second active layer are sequentially stacked on the substrate. The second source and the second drain are respectively located on two sides of the second gate and connect the second active layer. The material of the first active layer and the second active layer is metal oxide semiconductor. The first protection layer and the second protection layer are respectively located on the first active layer and the second active layer. The materials of the first protection layer and the second protection layer are $SiO_x$ and $SiO_y$, respectively, and x>y.

In another aspect, the present invention also directs to an array substrate, which includes a substrate and the thin film transistor structure above.

The oxygen contents of the first and the second protection layers are controlled to affect the oxygen vacancy number of the first and the second active layers to satisfy the various electrical requirements of the first and the second transistors.

The foregoing presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later. Many of the attendant features will be more readily appreciated as the same becomes better understood by reference to the following detailed description considered in connection with the accompanying drawings.

DETAILED DESCRIPTION

Figure 1:
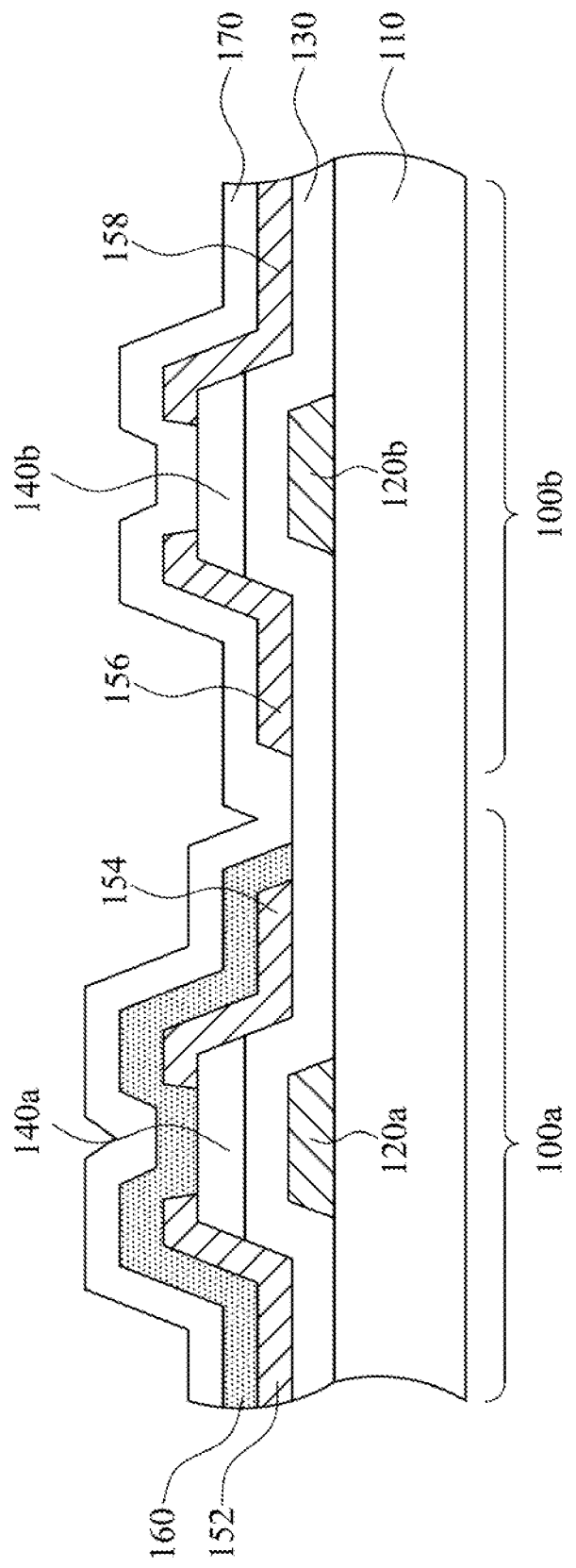
FIG. 1 is a cross-sectional diagram of a thin film transistor structure according to an embodiment of this invention.

Accordingly, the present invention is directed to a thin film transistor structure for satisfying the both demands of NBS and PBS tolerance. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In general, when the number of the oxygen vacancies in a metal oxide semiconductor material is increased, the density of free charge carriers can be increased to decrease the resistance of the metal oxide semiconductor material and thus increase the conductivity thereof. In addition, the oxygen content of a metal oxide semiconductor material can be very easily affected by the subsequent processing conditions. Therefore, the conditions of the subsequent processes can be controlled to change the oxygen content in a metal oxide semiconductor thin film had been formed. Some embodiments are disclosed below to illustrate how to control the processing conditions to change the oxygen content of the metal oxide semiconductor thin film to change the PBS and NBS tolerances.

Embodiment 1

FIG. 1 is a cross-sectional diagram of a thin film transistor structure according to an embodiment of this invention. In FIG. 1, the first transistor 100a and a second transistor 100b can be disposed on a substrate 110 to form a thin film transistor (TFT) array substrate. The first transistor 100a is a bottom gate TFT, which includes a first gate 120a, a gate insulating layer 130, a first active layer 140a, a first source 152, and a first drain 154. The first gate 120a is located on the substrate 110, and the gate insulating layer 130 and the first active layer 140a are sequentially stacked on the first gate 120a. Then, the first source 152 and the first drain 154 are sequentially formed on the two opposite sides of the first active layer 140a. Next, the first protection layer 160 and the second protection layer 170 are formed on the first transistor 100a. Consequently, the first source 152 and the first drain 154 are located between the first active layer 140a and the first protection layer 160.

The first active layer 140a is made from a metal oxide semiconductor material, such as indium gallium zinc oxide (IGZO), indium gallium oxide (IGO), indium zinc oxide (IZO), or zinc indium tin oxide (ZITO). When the first transistor 100a is a switch transistor, since the first transistor 100a needs better NBS tolerance, the first active layer 140a needs less oxygen vacancies, i.e. more oxygen content. Therefore, in this embodiment, the first protection layer 160 directly covering the first active layer 140a is a silicon oxide ($SiO_x$) layer with more oxygen content. The x in $SiO_x$ is 1.8-2.0, and the refractive index of the first protection layer 160 is 1.40-1.47.

The first protection layer 160 can be formed by chemical vapor deposition. The reactant gases are $N_2O$ and $SiH_4$, and the flow ratio of $N_2O$ to $SiH_4$ is greater than 120. The chemical vapor deposition is performed at a temperature more than 150° C. Since during the deposition of the first protection layer 160, the flow rate of the oxygen containing gas, $N_2O$, is greater, the oxygen vacancies in the metal oxide semiconductor material of the first active layer 140a can be replenished with oxygen to decrease the oxygen vacancies. Thus, the NBS tolerance of the first transistor 100a can be improved.

The second transistor 100b in FIG. 1 is also a bottom gate TFT, which includes a second gate 120b, the gate insulating layer 130, a second active layer 140b, a second source 156 and a second drain 158. The second gate 120b is located on the substrate 110, and the gate insulating layer 130 and the second active layer 140b are sequentially stacked on the second gate 120b. Then, the second source 156 and the second drain 158 are formed on the two opposite sides of the second active layer 140b. Next, the second protection layer 170 is formed on the second transistor 100b. Consequently, the second source 156 and the second drain 158 are located between the second active layer 140b and the second protection layer 170.

The second active layer 140b also can be made from a metal oxide semiconductor material, such as indium gallium zinc oxide (IGZO), indium gallium oxide (IGO), indium zinc oxide (IZO), or zinc indium tin oxide (ZITO). When the second transistor 100b is a driving transistor, since the second transistor 100b need more oxygen vacancies, i.e. less oxygen content. Therefore, in this embodiment, the second protection layer 170 directly covering the second active layer 140b is a silicon oxide ($SiO_y$) layer with less oxygen content and more hydrogen content. The y in $SiO_y$ is 1.4-1.8, and the refractive index of the second protection layer 170 is 1.47-1.50. In the second protection layer 170, hydrogen usually exists in a form of Si—H or Si—OH.

The second protection layer 170 can be formed by chemical vapor deposition. The reactant gases are $N_2O$ and $SiH_4$, and the flow ratio of $N_2O$ to $SiH_4$ is smaller than or equal to 120. The chemical vapor deposition is performed at a temperature smaller than or equal to 150° C. Since during the deposition of the second protection layer 170, the flow rate of the hydrogen containing gas, $SiH_4$, is greater, the oxygen vacancies in the metal oxide semiconductor material of the second active layer 140b can be increased. Thus, the PBS tolerance of the second transistor 100b can be improved.

In the above embodiment, comparing with the second protection layer 170, the first protection layer 160 is an oxygen-rich silicon oxide, which directly contacts the first active layer 140a of the first transistor 100a to decrease the oxygen vacancies in the first active layer 140a. Comparing with the first protection layer 160, the second protection layer 170 is an oxygen-deficient and hydrogen-rich silicon oxide, which directly contacts the second active layer 140b of the second transistor 100b to increase the oxygen vacancies in the second active layer 140b. According to another embodiment, the first transistor 100a and the second transistor 100b can be exchanged. That is, the first transistor 100a can be a driving transistor, and the second transistor 100b can be a switch transistor. Then, the materials of the first protection layer 160 and the second protection layer 170 also need to be exchanged to satisfy the needs of the electrical properties of the first transistor 100a and the second transistor 100b, respectively.

Embodiment 2

Figure 2:
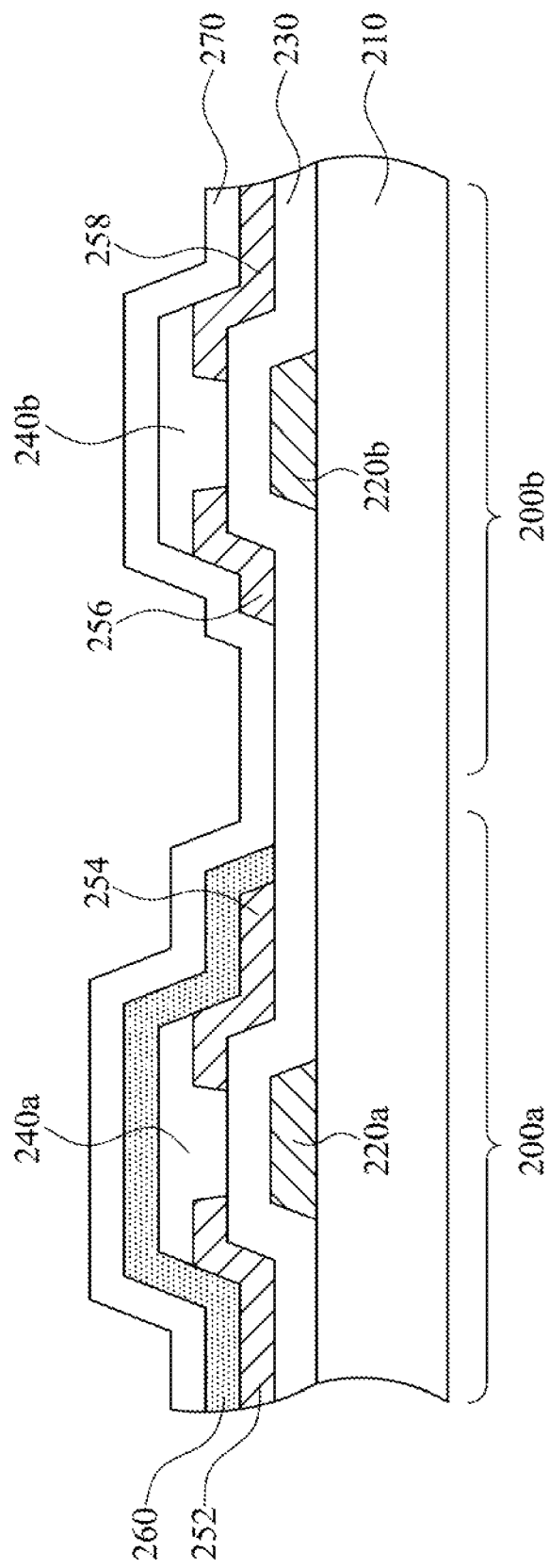
FIG. 2 is a cross-sectional diagram of another thin film transistor structure according to another embodiment of this invention.

FIG. 2 is a cross-sectional diagram of another thin film transistor structure according to another embodiment of this invention. In embodiment 1, the active layers are formed first, and then the sources and the drains. Comparing with embodiment 1, the only difference is that the sources and the drains are formed first, and then the active layers in the embodiment 2. The rest parts of the embodiment 2 are very similar to the embodiment 1, and are summarized below.

In FIG. 2, the first transistor 200a is a bottom gate TFT, which includes a first gate 220a, a gate insulating layer 230, a first active layer 240a, a first source 252, and a first drain 254. The first gate 220a is located on the substrate 210, and the gate insulating layer 230 is formed on the first gate 220a. Then, the first source 252 and the first drain 254 are formed on the two opposite sides of the first gate 220a. Next, the first active layer 240a, the first protection layer 260 and the second protection layer 270 are sequentially formed on the first transistor 200a. Consequently, the first source 252 and the first drain 254 are located between the gate insulating layer 230 and the first active layer 240a.

In this embodiment, the first protection layer 260 still can directly contact the first active layer 240a and is formed after the first active layer 240a. Therefore, no matter that the first protection layer 260 is an oxygen-rich silicon oxide layer or a hydrogen-rich silicon oxide layer; both can affect the oxygen vacancies in the metal oxide semiconductor material of the first active layer 240a, and thus the electrical properties of the first transistor 200a. Since the effect of the oxygen content or the hydrogen content of the first protection layer 160 to the first active layer 140a has been extensively discussed above in the embodiment 1, and thus the discussion is omitted here.

The second transistor 200b in FIG. 2 is also a bottom gate TFT, which includes a second gate 220b, the gate insulating layer 230, a second active layer 240b, a second source 256 and a second drain 258. The second gate 220b is located on the substrate 210, and the gate insulating layer 230 is formed on the second gate 220b. Then, the second source 256 and the second drain 258 are formed on the two opposite sides of the second gate 220b. Next, the second active layer 240b and the second protection layer 270 are sequentially formed on the second transistor 200b. Consequently, the second source 256 and the second drain 258 are located between the gate insulating layer 230 and the second active layer 240b.

In this embodiment, since the second protection layer 270 can directly contact the second active layer 240b, no matter that the second protection layer 270 is an oxygen-rich silicon oxide layer or a hydrogen-rich silicon oxide layer, both can affect the oxygen vacancy density in the metal oxide semiconductor material of the second active layer 240b, and thus the electrical properties of the second transistor 200b. Since the effect of the oxygen content or the hydrogen content of the second protection layer 170 to the second active layer 140b has been extensively discussed above in the embodiment 1, and thus the discussion is omitted here.

Embodiment 3

Figure 3:
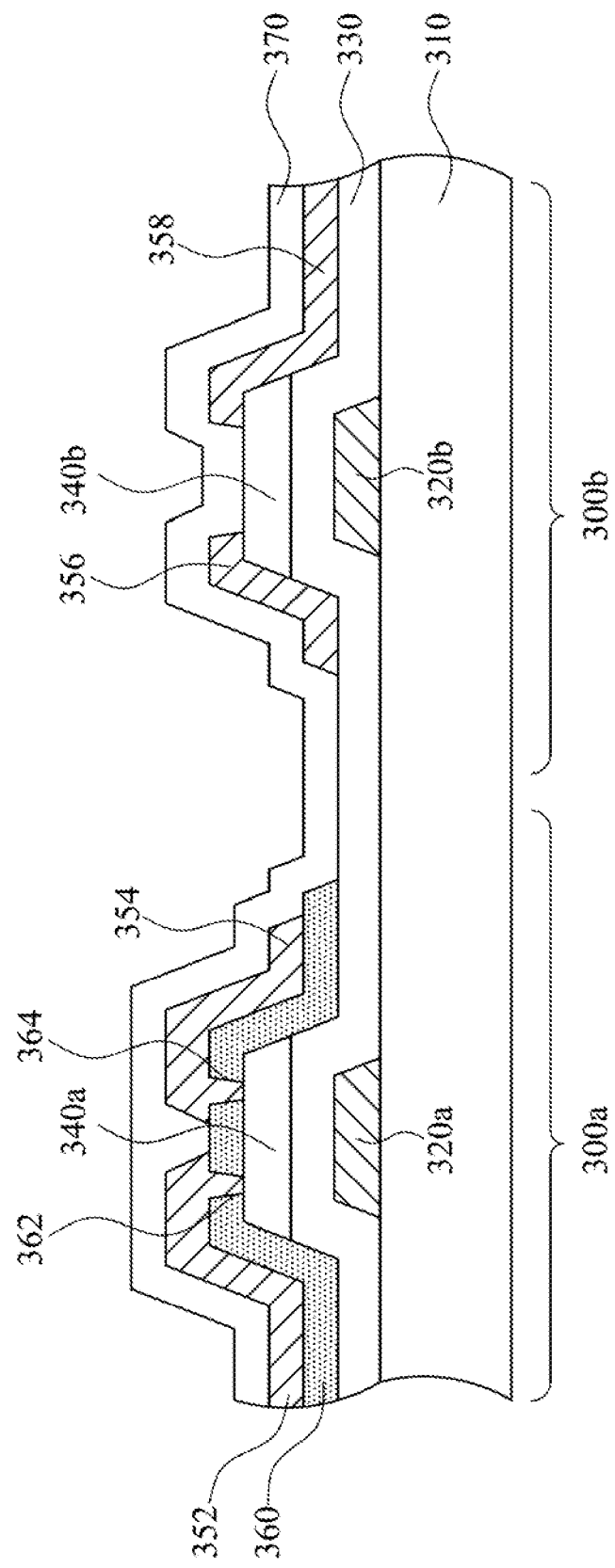
FIG. 3 is a cross-sectional diagram of yet another thin film transistor structure according to yet another embodiment of this invention.

FIG. 3 is a cross-sectional diagram of a structure of thin film transistors according to yet another embodiment of this invention. In embodiment 1, the sources and the drains are formed before the formation of the first protection layer. In embodiment 3, the first protection layer is formed before the formation of the sources and drains. The rest parts of the embodiment 3 are very similar to the embodiment 1, and summarized below.

In FIG. 3, the first transistor 300a is a bottom gate TFT, which includes a first gate 320a, a gate insulating layer 330, a first active layer 340a, a first source 352, and a first drain 354. The first gate 320a is located on the substrate 310, and the gate insulating layer 330, the first active layer 340a, and the first protection layer 360 are sequentially formed on the first gate 320a. Then, a first opening 362 and a second opening 364 are formed in the first protection layer 360 to expose portions of the first active layer 340a. Therefore, the first source 352 and the first drain 354 later-formed can contact the first active layer 340 respectively via the first opening 362 and the second opening 364. Consequently, the first source 352 and the first drain 354 are located between the first protection layer 360 and the second protection layer 370.

In this embodiment, the first protection layer 360 still can directly contact the first active layer 340a and is formed after the first active layer 340a. Therefore, no matter that the first protection layer 360 is an oxygen-rich silicon oxide layer or a hydrogen-rich silicon oxide layer; both can affect the oxygen vacancy density in the metal oxide semiconductor material of the first active layer 340a, and thus the electrical properties of the first transistor 300a. Since the effect of the oxygen content or the hydrogen content of the first protection layer 160 to the first active layer 140a has been extensively discussed above in the embodiment 1, and thus the discussion is omitted here.

The second transistor 300b in FIG. 3 is also a bottom gate TFT, which includes a second gate 320b, the gate insulating layer 330, a second active layer 340b, a second source 356 and a second drain 358. The second gate 320b is located on the substrate 310, and the gate insulating layer 330 and the second active layer 340b are sequentially stacked on the second gate 320b. Then, the second source 356 and the second drain 358 are formed on the two opposite sides of the second active layer 340b. Next, the second protection layer 370 is formed on the second transistor 300b. Consequently, the second source 356 and the second drain 358 are located between the second active layer 340b and the second protection layer 370.

In this embodiment, since the second protection layer 370 can directly contact the second active layer 340b, no matter that the second protection layer 370 is an oxygen-rich silicon oxide layer or a hydrogen-rich silicon oxide layer, both can affect the oxygen vacancy density in the metal oxide semiconductor material of the second active layer 340b, and thus the electrical properties of the second transistor 300b. Since the effect of the oxygen content or the hydrogen content of the second protection layer 170 to the second active layer 140b has been extensively discussed above in the embodiment 1, and thus the discussion is omitted here.

According to the above embodiments of this invention, the oxygen contents of the first protection layer and the second protection layer are used to affect the oxygen vacancies in the directly-contacting first active layer or the second active layer. Therefore, the needs of the various electrical properties of the first transistor and the second transistor can be satisfied.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A thin film transistor structure, comprising:
   a first gate and a second gate on a substrate;
   a gate insulating layer covering the first gate and the second gate;
   a first active layer and a second active layer disposed on the gate insulating layer and respectively over the first gate and the second gate, wherein a material of the first active layer and the second active layer is a metal oxide semiconductor;
   a first source and a first drain respectively located on two sides of the first gate and connecting the first active layer, wherein the first gate, the gate insulating layer, the first active layer, the first source and the first drain constitute a first transistor;
   a second source and a second drain respectively located on two sides of the second gate and connecting the second active layer, wherein the second gate, the gate insulating layer, the second active layer, the second source and the second drain constitute a second transistor;
   a first protection layer located on the first active layer; and
   a second protection layer located on and in contact with the second active layer,
   wherein materials of the first protection layer and the second protection layer are $SiO_x$ and $SiO_y$, respectively, and x>y.

2. The thin film transistor structure of claim 1, wherein a refractive index of the first protection layer is about 1.40-1.47.

3. The thin film transistor structure of claim 1, wherein a refractive index of the second protection layer is about 1.47-1.50.

4. The thin film transistor structure of claim 1, wherein the first protection layer is formed by chemical vapor deposition performed at a temperature more than 150° C., and a flow ratio of reactant gases $N_2O$ to $SiH_4$ is greater than 120.

5. The thin film transistor structure of claim 1, wherein the second protection layer is formed by chemical vapor deposition performed at a temperature smaller than or equal to 150° C., and a flow ratio of reactant gases $N_2O$ to $SiH_4$ is smaller than or equal to 120.

6. The thin film transistor structure of claim 1, wherein the first source and the first drain are located between the first active layer and the first protection layer.

7. The thin film transistor structure of claim 1, wherein the first source and the first drain are located between the gate insulating layer and the first active layer.

8. The thin film transistor structure of claim 7, wherein the second source and the second drain are located between the gate insulating layer and the second active layer.

9. The thin film transistor structure of claim 1, wherein the first source and the second drain are located between the first protection layer and the second protection layer, and the first protection layer has a first opening and a second opening to expose a part of the first active layer to make the first source and the first drain respectively connect the first active layer.

10. The thin film transistor structure of claim 1, wherein the x is about 1.8-2.0, and the y is about 1.4-1.8.

11. An array substrate, comprising:
a substrate; and
a thin film transistor structure, comprising:
  a first gate and a second gate on the substrate;
  a gate insulating layer covering the first gate and the second gate;
  a first active layer and a second active layer disposed on the gate insulating layer and respectively over the first gate and the second gate, wherein a material of the first active layer and the second active layer is a metal oxide semiconductor;
  a first source and a first drain respectively located on two sides of the first gate and connecting the first active layer, wherein the first gate, the gate insulating layer, the first active layer, the first source and the first drain constitute a first transistor;
  a second source and a second drain respectively located on two sides of the second gate and connecting the second active layer, wherein the second gate, the gate insulating layer, the second active layer, the second source and the second drain constitute a second transistor;
  a first protection layer located on the first active layer; and
  a second protection layer located on and in contact with the second active layer,
  wherein materials of the first protection layer and the second protection layer are $SiO_x$ and $SiO_y$, respectively, and x>y.

12. The array substrate of claim 11, wherein a refractive index of the first protection layer is about 1.40-1.47.

13. The array substrate of claim 11, wherein a refractive index of the second protection layer is about 1.47-1.50.

14. The array substrate of claim 11, wherein the first protection layer is formed by chemical vapor deposition performed at a temperature more than 150° C., and a flow ratio of reactant gases $N_2O$ to $SiH_4$ is greater than 120.

15. The array substrate of claim 11, wherein the second protection layer is formed by chemical vapor deposition performed at a temperature smaller than or equal to 150° C., and a flow ratio of reactant gases $N_2O$ to $SiH_4$ is smaller than or equal to 120.

16. The array substrate of claim 11, wherein the first source and the first drain are located between the first active layer and the first protection layer.

17. The array substrate of claim 11, wherein the first source and the first drain are located between the gate insulating layer and the first active layer.

18. The array substrate of claim 17, wherein the second source and the second drain are located between the gate insulating layer and the second active layer.

19. The array substrate of claim 11, wherein the first source and the second drain are located between the first protection layer and the second protection layer, and the first protection layer has a first opening and a second opening to expose a part of the first active layer to make the first source and the first drain respectively connect the first active layer.

20. The array substrate of claim 11, wherein the x is about 1.8-2.0, and the y is about 1.4-1.8.

* * * * *